United States Patent [19]

Purdham et al.

[11] Patent Number: 4,953,131

[45] Date of Patent: Aug. 28, 1990

[54] UNCONDITIONAL CLOCK AND AUTOMATIC REFRESH LOGIC

[75] Inventors: David M. Purdham, Brooklyn Park; James H. Scheuneman, St. Paul; Larry L. Byers, Apple Valley; Terence Sych, Minneapolis; Kwisook Tsang, Shoreview, all of Minn.

[73] Assignee: Unisys Corporation, Blue Bell, Pa.

[21] Appl. No.: 241,421

[22] Filed: Sep. 7, 1988

[51] Int. Cl.$^5$ .............................................. G11C 7/00
[52] U.S. Cl. ................................... 365/222; 365/233; 365/230.03
[58] Field of Search ................... 365/222, 189.08, 233, 365/230.03

[56] References Cited

U.S. PATENT DOCUMENTS 4,549,284 10/1985 Ikuzaki ............................... 365/222

Primary Examiner—Joseph A. Popek
Attorney, Agent, or Firm—John B. Sowell; Glenn W. Bowen; Robert S. Bramson

[57] ABSTRACT

A novel unconditional clock and automatic refresh logic system is provided which comprises a source of unconditional clock pulses coupled to the memory control logic in a manner which permits automatic refreshing of a dynamic memory. There is further provided clock logic means which sense the conditions in the dynamic memory system during which the dynamic memory is not being refreshed. There is further provided, means for generating automatic clock refresh signals coupled to the memory control logic for initiating continuous automatic refresh cycles when the system clock is being shutdown.

15 Claims, 4 Drawing Sheets

1

UNCONDITIONAL CLOCK AND AUTOMATIC REFRESH LOGIC

BACKGROUND OF THE INVENTION

1. Field of the Invention

The present invention is related to a system for refreshing a dynamic memory. More particularly, the present invention is related to a novel refresh clock system which enables a processing system to be stopped and to save the state of the system.

2. Description of the Prior Art

Modern computing systems are extremely sophisticated and are designed to recognize certain problems which cause interrupts or a desire to shutdown the system for analysis and maintenance. When such a system problem arises, it is desirable to be able to save the state of the latches in the memory unit and retain the data that is currently stored in the dynamic memory. If memory data is dumped before the latches are scanned, the state of the latches is changed and its original state is lost irretrievably. However, if the latches are first scanned before dumping memory data, the refresh clock signal to the memory is shut off so that memory data is lost. While the latches are being scanned, the contents (data) of the memory would be lost. It would be desirable to provide an unconditional clock and automatic refresh logic system which would permit the latches to be scanned while the memory is continuously refreshed, preserving the original contents of the memory for diagnostic purposes.

SUMMARY OF THE INVENTION

It is the principal object of the present invention to provide an unconditional clock and automatic memory refresh system that will preserve the state of a dynamic memory during shutdown or interruptions which normally discontinue memory refresh cycles.

It is another principal object of the present invention to provide an unconditional clock system which permits preservation of the status of the memory control logic and data paths without losing the contents of the dynamic memory.

It is another principal object of the present invention to provide an unconditional clock system which permits copying of the status of the memory control logic and data paths and the dynamic memory and permits subsequent restoration of the system back to its original status state for diagnostic purposes.

It is another principal object of the present invention to provide an unconditional clock system which permits running of a dynamic memory in an instruction step mode to permit examination of the changes in the control paths and data registers after stepping.

It is an object of the present invention to provide means for generating an unconditional clock and for employing the unconditional clock for automatically refreshing the dynamic memory when predetermined conditions exist.

It is another general object of the present invention to provide novel clock logic means for generating an unconditional clock signal and a conditional clock signal and for reconnecting the conventional clock to the memory system during normal operations after performing diagnostic operations and tests.

According to these and other objects of the present invention there is provided a novel unconditional clock and automatic refresh logic system which comprises a source of unconditional clock pulses coupled to the memory control logic in a manner which permits automatic refreshing of the dynamic memory. Further, there is provided clock logic means which sense conditions in the memory system during which the dynamic memory is not ordinarily refreshed and automatic clock refresh means coupled to the memory control logic means for initiating continuous automatic refresh cycles.

DESCRIPTION OF THE PREFERRED EMBODIMENT

Figure 1:
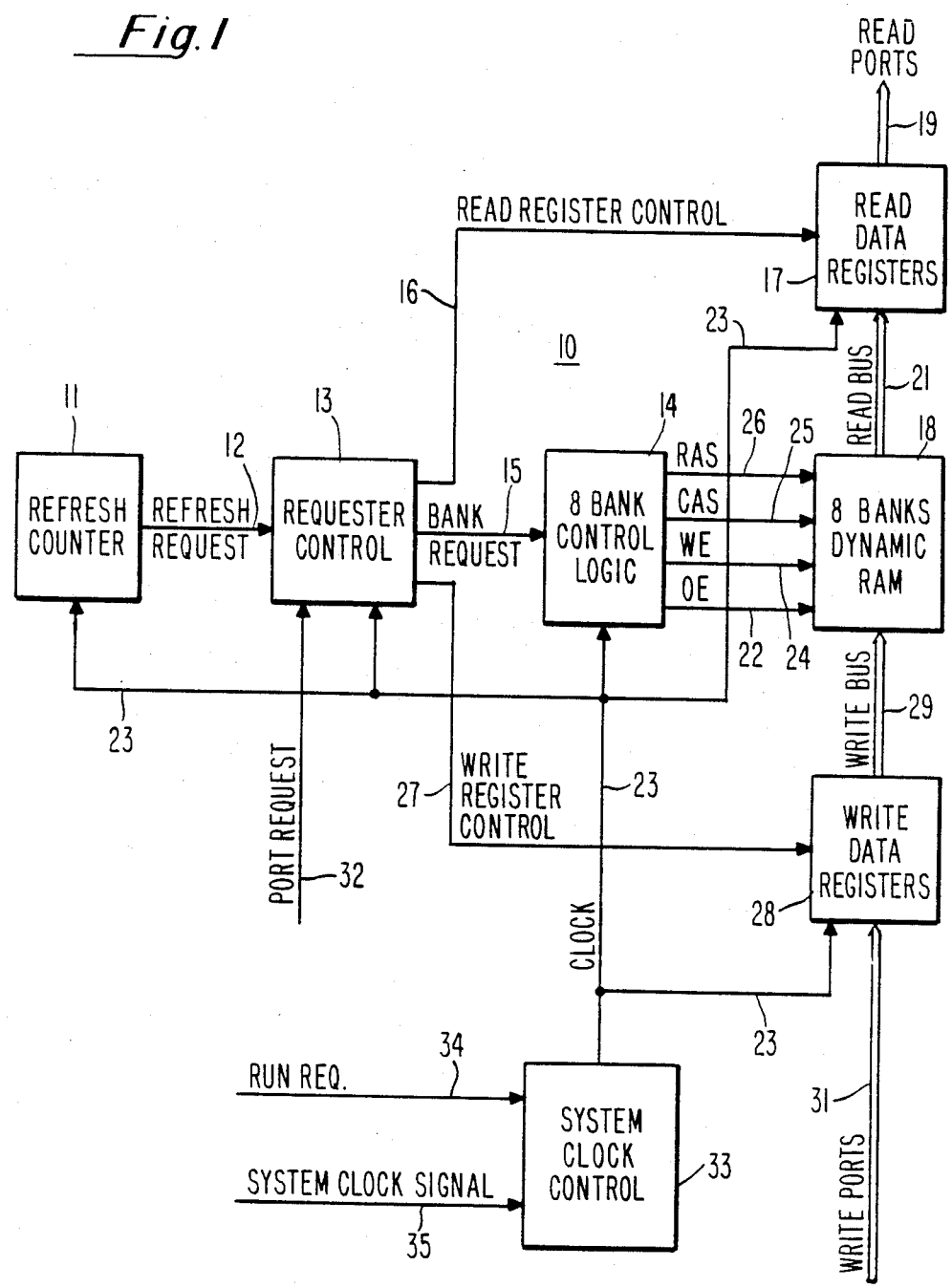
FIG. 1 is a block diagram of a prior art dynamic memory system and its associated clock control refresh logic.

Refer now to FIG. 1 showing a prior art dynamic memory system and associated clock controls of the type employed in Unisys 1100/90 mainframe computer systems. Memory and clock control system 10 comprises a refresh counter 11 which produces a count on output line 12, approximately every 12 to 14 microseconds to the requestor control 13 which is adapted to initiate refresh cycles in the bank control logic 14 via line 15, which is also used for normal memory access requests. During normal memory access requests, the read register control signal on line 16 enables the read data register 17 to load information from the banks of the dynamic RAM 18 to the CPU (not shown). The read register control signals on line 16 also permit the information in register 17 to be outputted to the CPU read ports via bus 19. The information being supplied on bus 19 is the same information which was supplied on the read bus 21 from the banks of the dynamic RAM 18. Output enable (OE) line 22 from bank control logic 14 is coupled to dynamic RAM 18 and enables the information in the dynamic RAM 18 to be outputted on the read bus 21 when clocked by the clock signal on line 23. The clock signal on line 23 is also applied to the bank control logic 14 and times the sequencing of the outputs from bank control logic 14 on lines 24, 25 and 26. The write enable (WE) signal on line 24 enables information to be stored in the dynamic RAM 18 as will be explained hereinafter. The column address strobe (CAS) on line 25 enables the start of the refresh cycle of the cells of the dynamic RAM 18. The row address strobe (RAS) on line 26 enables and completes the address identification of the cell being refreshed which is normal and conventional practice for one megabit static column DRAMs. During a write operation, the requestor control 13 generates a write register control signal on line 27 which is coupled to the write data registers 28 and produces the write data on the write bus 29 which is stored in the dynamic RAM 18. One of the eight write ports 31 is coupled to the input of the write data registers 28 and operates in a manner similar to the read data register 17 having 8 read output ports or busses 19. The aforementioned 8 ports (not shown) produce unique port request signals on line 32 which identify the bus or ports 19 and 31 being actuated for memory access.

In the prior art system 10, a system clock control 33 receives run request on line 34 and a system clock signal on line 35 which enable the clock control system to produce the clock signal on line 23 which coordinates the system of FIG. 1. The clock control system 33 was designed for and intended for normal access and refresh operations. This system did not supply a means for refreshing the dynamic RAM memory 18 when the system clock control was disabled, thus, the data stored in dynamic RAM 18 could be lost in 12 to 14 microseconds when interrupt or shutdown conditions occurred. While computers of the type employing the memory and clock control system 10 are not intended to shutdown, such conditions do occur and proper maintenance and diagnostic procedures can be enhanced by maintaining the system in its exact status at the instance in which interrupts and shutdowns occur. The prior art system 10 shown in FIG. 1 did not provide this capability.

Figure 2:
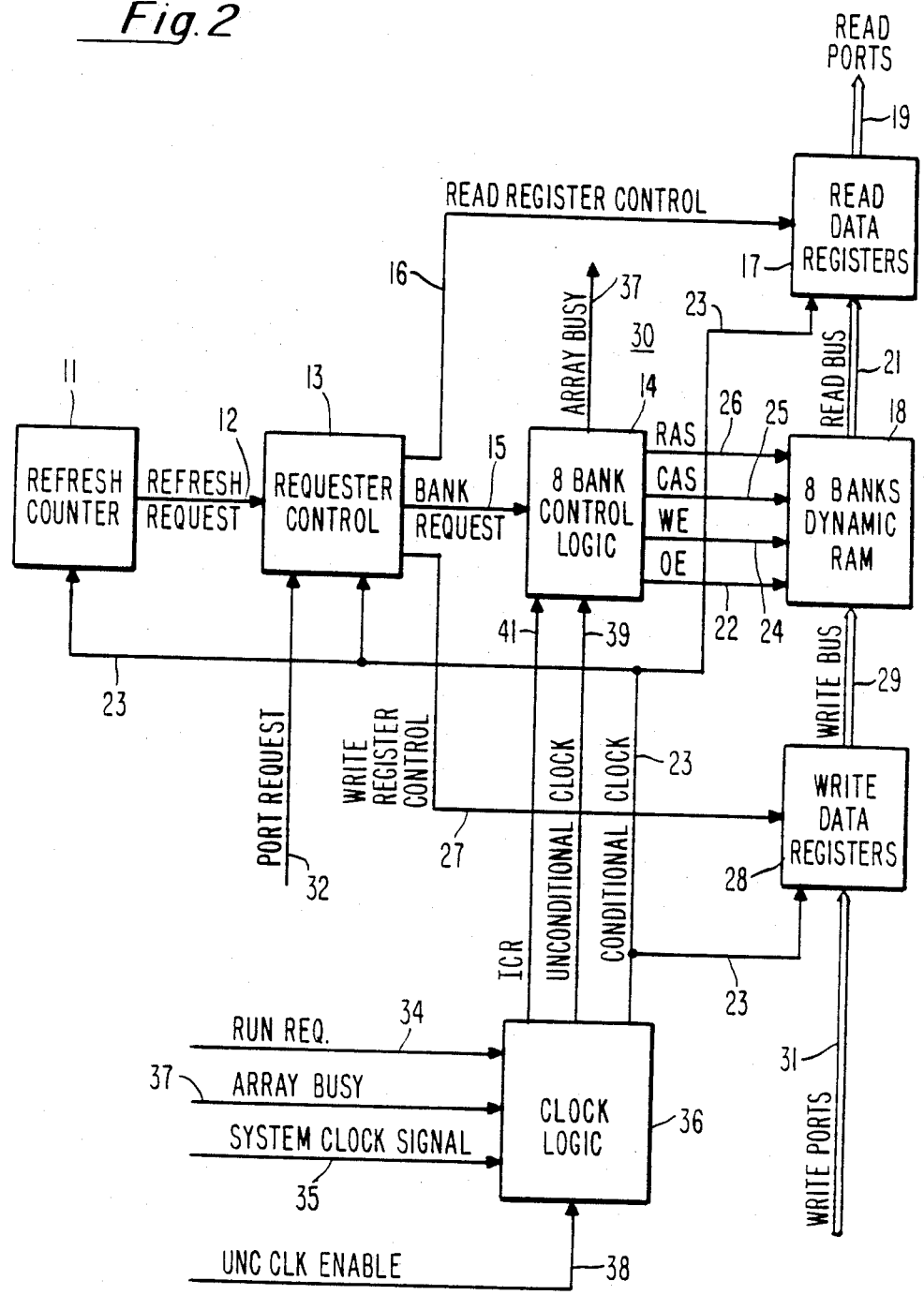
FIG. 2 is a block diagram of the present invention dynamic memory system which replaces components of the system of FIG. 1 showing the new and improved clock control refresh logic.

Refer now to FIG. 2 showing a block diagram of the present invention dynamic memory system 30. The environmental structure for the new and improved clock control refresh logic of the present invention is similar to FIG. 1, and employs some of the same elements as those employed in FIG. 1. Elements numbered the same as the elements in FIG. 1 operate in the manner as the elements in FIG. 1 and do not require additional explanation hereafter. It will be noted that the system clock control 33 of FIG. 1 is replaced with a new and improved clock logic 36 which will be explained in detail hereinafter. Clock output line 23 from clock logic 36 is now labeled a conditional clock, but is the same clock signal as previously produced for operation of the system 10, however, the clock signal on line 23 is not connected to the bank control logic 14 as previously in the system 10 of FIG. 1. An array busy output signal on line 37 from bank control logic 14 indicates that the control logic 14 is accessing the memory banks of dynamic RAM 18 and this signal is labeled array busy. The array busy signal on line 37 is shown as one of the logic inputs to the clock logic 36. The previously mentioned run request on line 34 is also applied to the clock logic 36. The previously mentioned system clock signal on line 35 is also applied to the clock logic 36. A new signal, generated at the computer, labeled unconditional clock enable on line 38 is also applied to a new clock logic 36. The unconditional clock enable signal on line 38 may be set up by either software programming or override manual entry by the operator of the computing system.

The aforementioned conditional clock on line 23, which times the operation of access and refresh of dynamic RAM 18, is connected to all of the system components as previously connected except the bank control logic 14. The control logic 36 generates an unconditional clock signal which is always applied to the bank control logic 14. When a shutdown or interrupt system arises that would ordinarily deprive the dynamic RAM 18 of its refresh cycle operation, the unconditional clock is present at the bank control logic 14 via line 39 and can be employed during a conventional access or refresh cycle. It will be noted that during such shutdown or interrupt conditions that the normal refresh counter 11 and requestor control 13 as well as the data read register 17 and write register 28 do not require the conventional clock signal. Accordingly, the novel clock logic element 36 applies an initiate continuous refresh (ICR) signal on line 41 which is applied to the bank control logic 14 and causes the bank control logic 14 to initiate the sequential signals CAS and RAS on lines 25 and 26 which perform the refresh cycle and maintain the dynamic memory 18 in its current status at the time of shutdown.

One of the diagnostic steps used in large mainframe computers such as the Unisys 1100/90 is known as a scan set operation or scan operation in which the latches associated with different systems of the computer can be sensed or read out to determine their status at the time of shutdown or interruption for diagnostic purposes. However, sensing of the latches during a scan operation requires a time greater than the refresh cycle time and also requires that the conventional clock be shut off or discontinued in order to perform the scan operation, thus, the status of the memory cells in the dynamic memory 18 is lost. Stated differently, if it was desirable to determine and maintain both the status of the latches in the system 30 and the status of the cells in the dynamic RAM 18, it was impossible to perform the operation in the prior art because scanning the latches before dumping or reading the memory disturb the status of the latches to be sensed. If the dynamic RAM 18 is sensed first, the latches are changed. If the latches are sensed first, then the status of the dynamic RAM memory 18 is lost in the prior art system. In the present invention system shown in FIG. 2 it is possible to initiate an automatic refresh cycle so that the dynamic memory 18 maintains its contents while the latches associated with the system 30 are sensed. Subsequently reading out the dynamic RAM 18 allows a copy of the status of memory 18 to be obtained. The system 30 can then be restored back to its original status for diagnostic purposes. The restored status quo system 30 could then be operated in an instruction step cycle mode to speed up diagnostic procedures.

Figure 3:
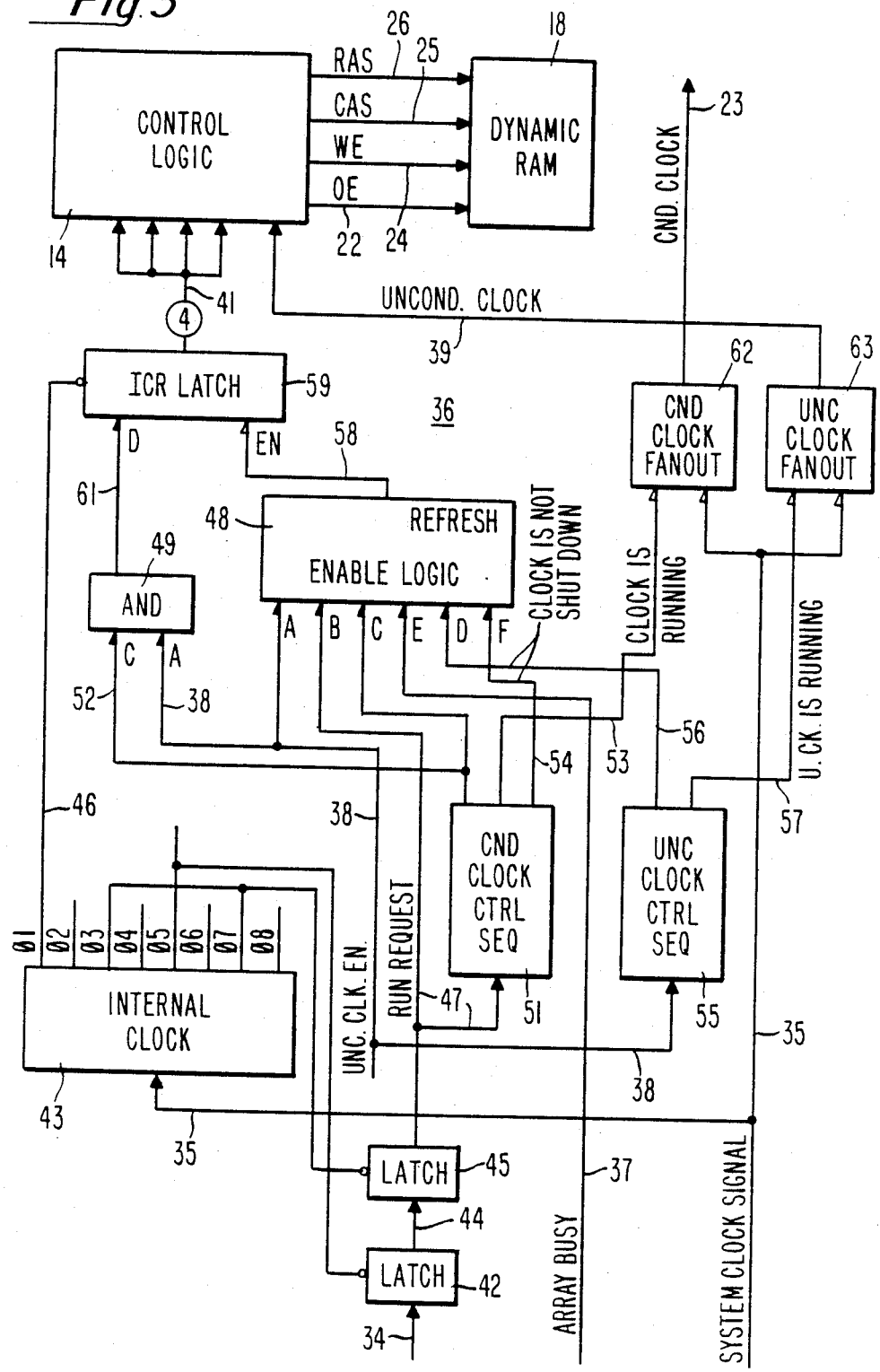
FIG. 3 is a detailed block diagram of the novel unconditional clock and automatic refresh control logic circuit of the present invention.

Refer now to FIG. 3 showing a detailed block diagram of the novel unconditional clock and automatic refresh control logic block 36 shown in FIG. 2. The clock logic system 36 receives the run request on line 34, the array busy signal on line 37, the system clock signal from the computer on line 35 and the new unconditional clock enable signal on line 38 as described hereinbefore. The run request signal on line 34 is loaded into latch 42 during phase 5 ($\phi 5$) of the internal clock 43. The output signal from latch 42 on line 44 is loaded into latch 45 during phase 3 ($\phi 3$) of the internal clock 43. Clock 43 is shown producing a phase 1 ($\phi 1$) clock signal on line 46 which will be employed to initiate the continuous refresh cycle to be explained hereinafter.

The process run request signal on line 47 is available at phase 3 ($\phi 3$) of the internal clock and is applied to the refresh enable logic 48 also shown as input B. The unconditional clock enable signal on line 38 is applied to AND gate 49 and to the refresh enable logic 48 and is labeled input A. The conditional clock control sequence block 51 generates three output signals. The output signal on line 52 is a sequence 6 operation indicating that the conditional clock is being shutdown. This input line 52 to refresh enable logic 48 is also labeled input C. The conditional clock control sequence block 51 output on line 53 is a sequence 2, 3, 4 signal indicating that the conditional clock 51 is running. The output on line 54 from clock controller 51 is a sequence 2 signal indicating that the clock is not shutdown and is labeled input F to refresh enable logic 48. The unconditional clock control sequence block 55 is shown having two outputs. The first output on line 56 is a sequence 2 signal indicating that the unconditional clock is not shutdown. The sequence 2, 3, 4 signal on line 57 indicates that the unconditional clock is running. The array busy signal on line 37, which was generated from the bank control logic 14, is applied to the refresh enable logic 48 as input E.

The initiate continuous refresh (ICR) cycle latch 59 generates the continuous refresh signal on line 41. When the C input on line 52 to logic 48 is active and the unconditional clock enable signal (input A) on line 38 is active, a data signal is generated at the output of AND gate 49 on line 61 at the input of latch 59. Latch 59 is enabled by line 58 which sets latch 59 and initiates an automatic refresh cycle starting at phase 1 ($\phi$1) of the internal clock 43. The four fan out signals on line 41 from latch 59 to control logic 14 initiates an alternating sequence of CAS and RAS signals on lines 25 and 26 which continuously refresh the memory cells of dynamic RAM 18. Thus, if the clock is being shutdown as indicated on line 52, the clock logic system 36 shown in FIG. 3 will automatically initiate a refresh cycle and prevent the dynamic RAM memory 18 from losing its status.

After diagnostic and testing procedures have been performed, it may be desirable to reinitiate the conditional clock which was the only previous clock in the prior art system and to start this clock in the correct sequence of clock signals. The resynchronization of the conditional clock is initiated when the signal on line 58 to latch 59 has the condition $\overline{F}\cdot D\cdot E\cdot(B+\overline{A})$. The aforementioned condition implies that the conditional clock has been stopped and the unconditional clock is running and the array busy signal is high and either we are receiving a run request or the unconditional enable signal is low.

A conditional clock fan out block 62 receives the input signals on lines 35 and 53 to produce the aforementioned conditional clock signal 23 employed in FIGS. 1 and 2. The unconditional clock fan out block 63 receives the input signals on lines 35 and 57 to produce the unconditional clock on line 39 which is applied to the bank control logic 14 only. When the resynchronization of the ICR latch 59 occurs, the unconditional clock signal on line 39 is still employed to perform accessing and refresh cycles in the dynamic RAM 18 and the conditional clock on line 23 enables the normal refresh counter 11 and request control block 13 to initiate bank request on line 15 which initiate normal refresh cycles at least every 12 to 14 microseconds.

Figure 4:
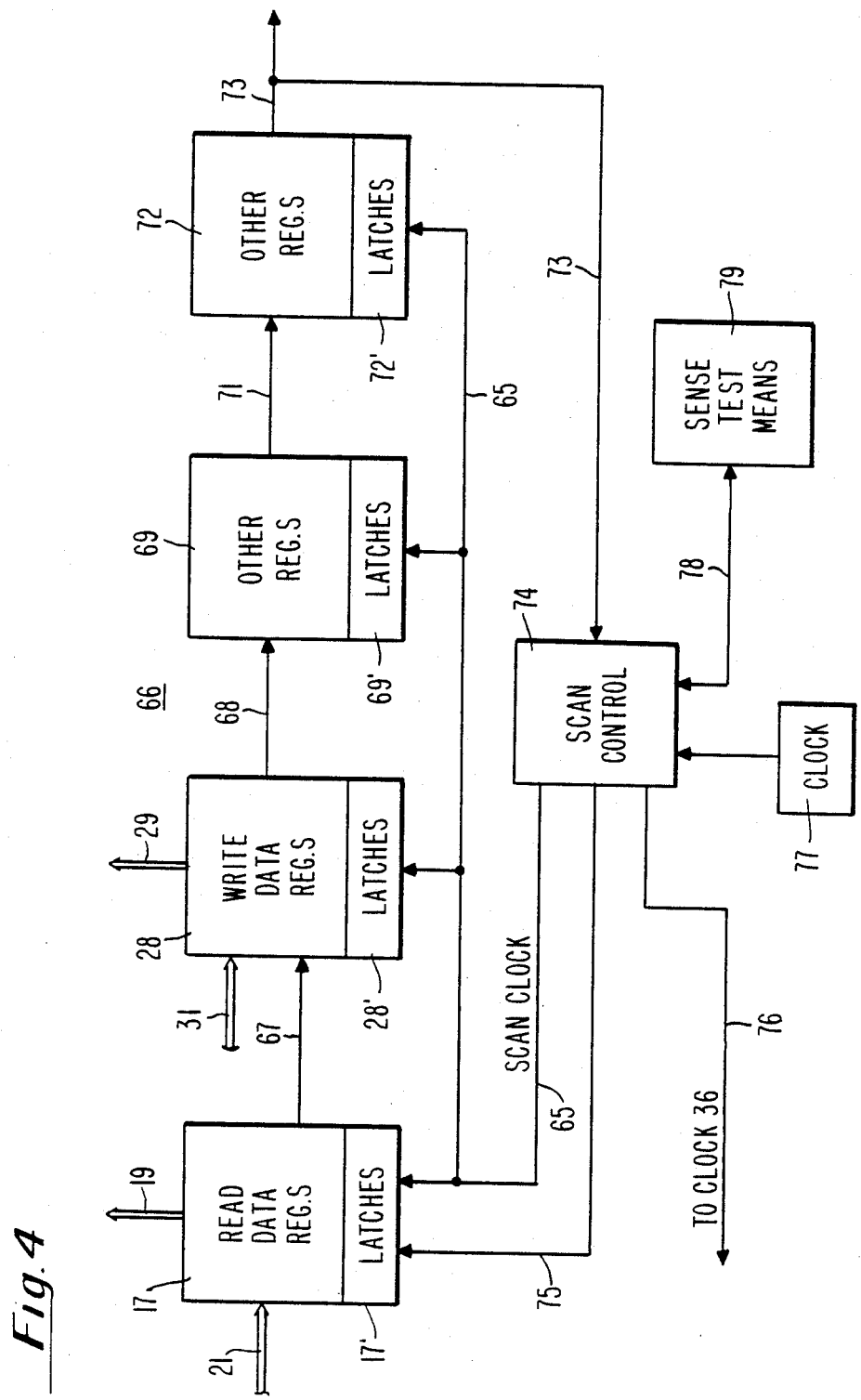
FIG. 4 is a block diagram of a string of registers arranged in a scan-set configuration for determining the state of the latches in the registers after clock shutdown.

Refer now to FIG. 4 showing a block diagram of a string of registers arranged in a scan-set configuration 66 for determining the state of the latches in the registers after a clock shutdown. Read data registers 17 are shown as in FIG. 2 having the same read bus 21 input and the read port bus output 19. Read data registers 17 are provided with latches 17' that are employed to store the read data as well as to perform logic functions required for transferring data from the DRAM memory 18 to the processor. Output scan data line 67 is connected to latches 17' and applied as an input to the logic and latches 28' of write data registers 28. A second scan data line 68 is coupled between the latches 28' and the latches 69' and associated logic of registers 69 also in the string. Similarly, the third scan data line 71 connects to the latches 69' and to the latches 72' of additional registers 72 which completes the string of registers shown. It will be understood that additional registers may be included in the string shown to have a scan data output line 73 connected to the scan data control 74. The output of the scan data control 74 on line 75 is connected back to the latches 17' to complete the loop of the string.

During a normal mode of operation, all of the registers in the string are being operated by the conditional clock 23 as explained hereinbefore. When a shutdown occurs, the conditional clock on line 23 is shut off as explained hereinbefore. A scan clock signal on line 65 is generated when it is desired to sense the state of the latches 17', 28', 69', 72' etc. For this purpose scan control 74 generates a drop run request on line 76 which is coupled to clock 36 for terminating the clock 23. After the scan control 74 terminates the conditional clock on line 23, it employs its associated scan clock 77 to generate a clock signal which is routed to each of the register latches to be scanned to clock the information in the latches onto the scan data lines and to clock the information (in a shift register form) onto scan data line 73. Scan control 74 reads the state of the registers sequentially and supplies the state of the registers as signal information on line 78 to the sense test means 79. Sense test means 79 may take the form of a separate computer, a display terminal, or other forms of memory or visual display means. At the end of a scan operation the registers will be placed back in their original state at the time of the scan operation, but may be changed or placed in a different state by scan control 74 during the time the information is being shifted in the scan-set configuration loop.

Having explained the operation of the prior art memory system 10 and the preferred mode of operation of the improved automatic refresh and clock logic system 30, it will be understood that it is no longer necessary to lose the state of either the logic and data path latches or the contents of the dynamic RAM during shutdown and interrupt operations which would require subsequent diagnostic and testing procedures. Thus, by preserving the last state of the latches and the contents of the dynamic memory before clock interruption and shutdown, it is possible not only to more accurately diagnose problems which cause interrupts and shutdowns but it is also possible to place the processing system back into operation much faster than it was heretofore possible.

What we claim is:

1. An unconditional clock and automatic refresh logic circuit comprising:

a dynamic memory of the type which is refreshed during a normal mode of operation by clock control signals, memory access and refresh control logic coupled to said dynamic memory, means for disabling said clock control signals during a mode of operation other than a normal mode of operation, a system clock, clock logic means coupled to said system clock and to said memory access and refresh control logic, said clock logic means comprising means for sensing the condition that clock signals normally coupled to said dynamic memory have been disabled, said clock logic means further comprising unconditional clock means coupled to said system clock and to said dynamic memory access and refresh control logic, and continuous refresh means coupled between said dynamic memory and memory access and refresh control logic for initiating continuous refresh cycles of said dynamic memory employing said unconditional clock means.

2. An unconditional clock circuit as set forth in claim 1 wherein said clock logic means comprises an internal clock having a plurality of phased outputs occurring during each system clock cycle.

3. An unconditional clock circuit as set forth in claim 1 wherein said unconditional clock means of said clock logic means comprises means for determining when the system clock is being disabled.

4. An unconditional clock circuit as set forth in claim 3 wherein said means for determining when the system clock is being disabled comprises conditional clock control sequence means.

5. An unconditional clock circuit as set forth in claim 4 wherein said unconditional clock means of said clock logic means further includes means for initiating continuous clock refresh cycles coupled to said conditional clock control sequence means.

6. An unconditional clock circuit as set forth in claim 5 wherein said means for initiating continuous clock refresh cycles comprises a clock refresh latch and refresh enable logic means coupled to said conditional clock control sequence means.

7. An unconditional clock circuit as set forth in claim 1 which further includes means for generating an unconditional clock enable signal.

8. An unconditional clock circuit as set forth in claim 7 wherein said unconditional clock enable signal is generated by a processing system associated with said dynamic memory.

9. An unconditional clock circuit as set forth in claim 8 wherein said processing system associated with said dynamic memory further includes, latch means for operating registers associated with said dynamic memory, test means for selectively sensing the state of said latch means in a scan-set configuration during a test operations, said clock logic means being coupled to said latch means and to said dynamic memory for periodically refreshing said dynamic memory during a normal memory access operation, and said unconditional clock means being coupleable to said dynamic memory means during an interrupt operation, 10. An unconditional clock circuit as set forth in claim 9 which further includes, run request means for stopping said first clock signals from reaching said latch means during an interrupt operation and for connecting said unconditional clock means to said dynamic memory, scan control means for preserving the state of said latch means at the start of an interrupt operation and for preserving the contents of said dynamic memory, and scan test means coupled to said scan control means for reading the state of said latches which indicate the state of said registers and said dynamic memory at the time of said interrupt operation.

11. An unconditional clock circuit as set forth in claim 10 wherein said scan control means further includes an independent scan control clock.

12. An unconditional clock circuit as set forth in claim 11 which further includes re-synchronization means for re-synchronization and re-initiating said first clock in a proper sequence of operations upon return of said computing system to normal operations.

13. An unconditional clock circuit as set forth in claim 1 wherein said clock logic means comprises conditional clock control sequence means and an unconditional clock control sequence means coupled to means for generating an unconditional clock enable signal.

14. An unconditional clock circuit as set forth in claim 13 which further includes refresh enable logic means coupled to said conditional clock control sequence means and said unconditional clock control sequence means for generating an enable signal to enable continuous clock refresh cycles.

15. An unconditional clock circuit as set forth in claim 14 which further includes means for initiating continuous refresh cycles coupled to said enable signal and coupled to the output of said conditional clock control sequence means having an output indicating that the system clock is being disabled.

* * * * *